(12) United States Patent
Sundararajan et al.

(10) Patent No.: US 7,367,007 B1
(45) Date of Patent: Apr. 29, 2008

(54) METHOD OF ROUTING A DESIGN TO INCREASE THE QUALITY OF THE DESIGN

(75) Inventors: Prasanna Sundararajan, San Jose, CA (US); Carter Hamilton, San Jose, CA (US); Ian L. McEwen, Golden, CO (US)

(73) Assignee: Xilinx, Inc., San Jose, CA (US)

( * ) Notice: Subject to any disclaimer, the term of this patent is extended or adjusted under 35 U.S.C. 154(b) by 265 days.

(21) Appl. No.: 11/170,408

(22) Filed: Jun. 29, 2005

(51) Int. Cl.
*G06F 17/50* (2006.01)

(52) U.S. Cl. .......................................... 716/16; 716/13
(58) Field of Classification Search ............. 716/12–16
See application file for complete search history.

(56) References Cited

U.S. PATENT DOCUMENTS

| | | | |
|---|---|---|---|
| 5,835,751 A * | 11/1998 | Chen et al. ................... | 716/16 |
| 6,938,236 B1 * | 8/2005 | Park et al. .................... | 716/17 |
| 2003/0028852 A1 * | 2/2003 | Thurman et al. ............. | 716/12 |
| 2003/0200520 A1 * | 10/2003 | Huggins et al. .............. | 716/16 |
| 2005/0280438 A1 * | 12/2005 | Park ............................ | 326/41 |

* cited by examiner

*Primary Examiner*—Jack Chiang
*Assistant Examiner*—Binh Tat
(74) *Attorney, Agent, or Firm*—Kevin T. Cuenot

(57) ABSTRACT

A method of circuit design for a programmable logic device (PLD) can include identifying a plurality of routing resources, wherein each of the plurality of routing resources is associated with a reliability measure, and selecting routing resources for use in routing a circuit design for the PLD according to, at least in part, the reliability measures. The circuit design for the PLD can be routed using the selected routing resources.

11 Claims, 3 Drawing Sheets

| Routing Resource | SA-0 Fault Coverage | SA-1 Fault Coverage | Reliability Measure |
|---|---|---|---|
| A | 0 | 0 | 0 |
| B | 3 | 1 | 9 |
| C | 0 | 2 | 1 |
| D | 7 | 4 | 12 |
| E | 29 | 42 | 14 |
| F | 0 | 300 | 3 |
| G | 125 | 52 | 14 |

METHOD OF ROUTING A DESIGN TO INCREASE THE QUALITY OF THE DESIGN

BACKGROUND

1. Field of the Invention

This invention relates to the field of electronic circuit design for programmable logic devices and, more particularly, to increasing the reliability and/or quality of such circuit designs.

2. Description of the Related Art

A programmable logic device (PLD) is a type of integrated circuit that can be programmed to perform specified logic functions. A field programmable gate array (FPGA) is one variety of PLD which can include several different types of components. An FPGA usually includes configurable logic blocks (CLBs), programmable input/output blocks (IOBs), and a programmable interconnect structure which links the CLBs and IOBs. Some FPGAs also can include specialized components such as delay-locked loops, RAMs, processors, and the like.

Modern PLDs not only are large in size, but also are complex in nature. Such devices must be rigorously tested as a malfunction can produce unexpected results. After the PLD is fabricated, it can be tested through known testing methods. Commonly, testing involves the creation of a number of different test patterns targeted at exercising various portions or resources of the PLD. A test pattern refers to a configuration bitstream and a corresponding set of input vectors. The test patterns typically are designed by a team of test engineers. When loaded into the PLD under test, the configuration bitstream configures the PLD with a test design. Once configured with a test design, the input vectors can be applied to the PLD. Actual outputs from the PLD can be compared with expected outputs to identify fault conditions within the PLD.

To test routing resources within an FPGA, for example, a plurality of test designs are sequentially loaded and tested. The test designs typically are based upon a full FPGA design which supports "walking one" or "walking zero" chain methodologies. "Walking" one or zero refers to the process of initializing the entire chain or signal path through the device to logic one or zero respectively. Each segment of the chain separated by a flip-flop or other similar storage element requires one clock cycle to transfer data. Once the chain is initialized to logic zero or one, the opposite value is introduced and walked through the signal path. For instance, if initialized to logic zero, a logic one is introduced and walked through the signal path. This process takes M clock cycles where M is the number of storage elements in the signal path through which the value must pass. The opposite value shows up at the output of the design after M clock cycles in a successful test.

Each test pattern can be designed to test for one or more different fault models. For example, a test pattern can be designed to test or detect a particular type of fault such as a stuck at 0 (SA0) or a stuck at 1 (SA1) fault in reference to a signal being stuck in a low or high state. Each test pattern further can be targeted at testing specific routing resources of the PLD under test. Detection of an SA0 or SA1 fault when executing a particular test pattern can provide an indication as to which element of the PLD is malfunctioning. Test patterns can be designed to test other varieties of faults beyond SA0 or SA1 faults.

Modern PLDs, however, include a very large number of routing resources. To test each routing resource of a PLD would be impractical due to the significant time and cost involved. Also, in some cases, it is not possible to isolate and test a routing resource by itself because that resource can only be accessed through some other routing resource. Notwithstanding, it is desirable for PLD manufacturers to test as many routing resources as possible. Accordingly, a significant number of test patterns are run using a stochastic approach. Due to overlap with respect to the test patterns, some routing resources are tested or exercised more frequently than others. Other routing resources, however, may not be tested at all.

After meeting necessary quality standards, the PLD is made available to end users, in this case design engineers, responsible for designing a circuit that is to be implemented using the PLD. At some point, the circuit design is routed. Conventional software-based design tools take several factors into account when routing a circuit design. These factors can include signal propagation delays and power consumption. The circuit design can be routed in such as way as to minimize signal propagation delays and/or power consumption.

While conventional design tools consider different factors when routing a circuit design, the reliability of the routing resources selected for a route is not among those factors. In illustration, when given a choice between two routing resources, a router is equally likely to select a routing resource that has been thoroughly tested as one that has not. Such is the case, as timing constraints and, possibly, power consumption largely drive the routing process. It would be beneficial to determine measures of reliability for routing resources of a PLD. Further, it would be beneficial to route the PLD such that routing resources considered to be more reliable are favored over routing resources which are considered less reliable.

SUMMARY OF THE INVENTION

The present invention provides methods relating to improving the quality level of a design. One embodiment of the present invention can include a method of circuit design for a programmable logic device (PLD). The method can include identifying a plurality of routing resources, wherein each of the plurality of routing resources is associated with a reliability measure, and selecting routing resources for use in routing a circuit design for the PLD according to, at least in part, the reliability measures. The method further can include routing the circuit design for the PLD using the selected routing resources.

In one embodiment, a routing resource having a higher reliability measure can be selected for use during the routing phase over a routing resource having a lower reliability measure. In another embodiment, the routing phase can include, for a signal path, limiting the plurality of routing resources from which routing resources are selected to those that result in a route for the signal path which conforms to a design constraint for the signal path. The design constraint can be a timing constraint, a power consumption constraint, or both. It should be appreciated, however, that this listing is not intended to be exhaustive and that one or more other design constraints can be used. Accordingly, after limiting the selections, a routing resource can be selected from the plurality of routing resources that has a highest reliability measure.

It should be appreciated that if reliability is considered most important by a designer, reliability measures can be favored more heavily than other design constraints when routing the PLD. This can result in a highly reliable design which may not meet other design constraints. If, however, reliability is considered to be of less importance than other design constraints, such as timing and/or power consumption, then the PLD can be routed in a way that favors selected design constraints over reliability. This can lead to a situation in which the design meets one or more selected design constraints but not reliability constraints or standards.

Thus, if at least one design constraint is specified for the circuit design, the selecting step can include choosing routing resources for use in the routing step according the reliability measures and the at least one design constraint, wherein the reliability measures are given a higher priority weight than the at least one design constraint. In another embodiment, where at least two of the plurality of routing resources have an equivalent reliability measure and, if selected, result in more than one alternate route for a signal path, with each alternate route conforming to a design constraint for the signal path, a routing resource can be selected from the two or more of the plurality of routing resources that produces the alternate route which conforms to the design constraint to a greater degree.

In the case where two or more of the plurality of routing resources have reliability measures that exceed a threshold and, if selected, result in more than one alternate route for a signal path, with each alternate route conforming to a design constraint for the signal path, the method can include selecting a routing resource from the two or more of the plurality of routing resources that produces the alternate route which conforms to the design constraint to a greater degree.

Another embodiment of the present invention can include a method of determining reliability measures for routing resources of a PLD. The method can include processing a test suite for testing a plurality of routing resources of the PLD and determining fault type coverage for each of the plurality of routing resources. The fault type coverage can indicate a number of times a routing resource is tested for at one or more fault types. The method further can include calculating a reliability measure for each of the plurality of routing resources according to the fault type coverage. The fault type coverage further can indicate a number of times a routing resource is tested for each of a plurality of different fault types.

The calculating step can include computing an average of the number of times a routing resource is tested for each of the plurality of different fault types. A value for the number of times a routing resource is tested for each of the plurality of different fault types first can be limited to a threshold. A bonus can be selectively added to each reliability measure according to whether the routing resource is tested for more than one fault type. The bonus value can be equivalent to the threshold value. The circuit design for the PLD can be routed according to, at least in part, the reliability measure for each of the plurality of routing resources.

Another embodiment of the present invention can include a method of circuit design for a PLD. The method can include identifying a plurality of routing resources available for routing a signal path of a circuit design for the PLD. From the plurality of routing resources, the available routing resources for routing the signal path can be limited to those routing resources which meet a design constraint for the signal path. The design constraint can be a timing constraint, a power consumption constraint, or both. The signal path can be routed using selected ones of the available routing resources based, at least in part, upon a reliability measure associated with each of the available routing resources. The reliability measure can be computed such that a routing resource that has been tested for N different fault types has a lower reliability measure than a routing resource that has been tested for N+1 different fault types.

The routing step can include using a routing resource having a higher reliability measure in lieu of a routing resource having a lower reliability measure from the available routing resources. In the case where two or more of the plurality of routing resources have equivalent reliability measures and, if used to route the signal path, form alternate routes that conform to the design constraint for the signal path, the method can include routing the signal path by selecting a routing resource from the two or more of the plurality of routing resources that produces the alternate route which conforms to the design constraint to a greater degree. In the case where two or more of the plurality of routing resources have reliability measures that exceed a threshold and, if used to route the signal path, form alternate routes that conform to the design constraint for the signal path, the method can include routing the signal path by selecting a routing resource from the two or more of the plurality of routing resources that produces the alternate route which conforms to the design constraint to a greater degree.

BRIEF DESCRIPTION OF THE DRAWINGS

There are shown in the drawings, embodiments which are presently preferred, it being understood, however, that the invention is not limited to the precise arrangements and instrumentalities shown.

FIG. 2 is a table illustrating test data and reliability measures in accordance with the inventive arrangements disclosed herein.

DETAILED DESCRIPTION OF THE INVENTION

Embodiments of the present invention provide techniques for routing a circuit design for a programmable logic device (PLD), such as a field programmable gate array (FPGA), in a manner that increases the quality and/or reliability of the resulting circuit design. In one embodiment of the present invention, reliability of the circuit design can be considered of equal or lesser importance with respect to other design constraints. In that case, the embodiment can facilitate the generation of a highly reliable circuit design which also meets other design constraints provided by the designer. In another embodiment, reliability of the circuit design can be considered of prime importance. In that case, other design constraints can be considered of secondary importance in view of quality and/or reliability.

In accordance with the inventive arrangements disclosed herein, reliability measures can be determined for routing resources of a PLD. The reliability measures can be calculated based upon fault coverage data obtained from reviewing a test suite associated with the PLD. Each reliability measure can be associated with a particular routing resource to provide an indication of the extent to which that routing resource is tested by the test suite. Accordingly, routing resources associated with higher reliability measures are considered to be more reliable than routing resources with lower reliability measures. Routing resources with higher reliability measures further are likely to be tested for a larger number of fault types.

Subsequently, when a circuit design for the PLD is routed, the reliability measures can be taken into account. Routing resources having higher reliability measures can be favored over those with lower reliability measures. By routing the circuit design in this manner, a more reliable and higher quality design can be achieved. The reliability measures can be used independently of, or in combination with, other parameters such as timing constraints when the circuit design is routed.

Figure 1:
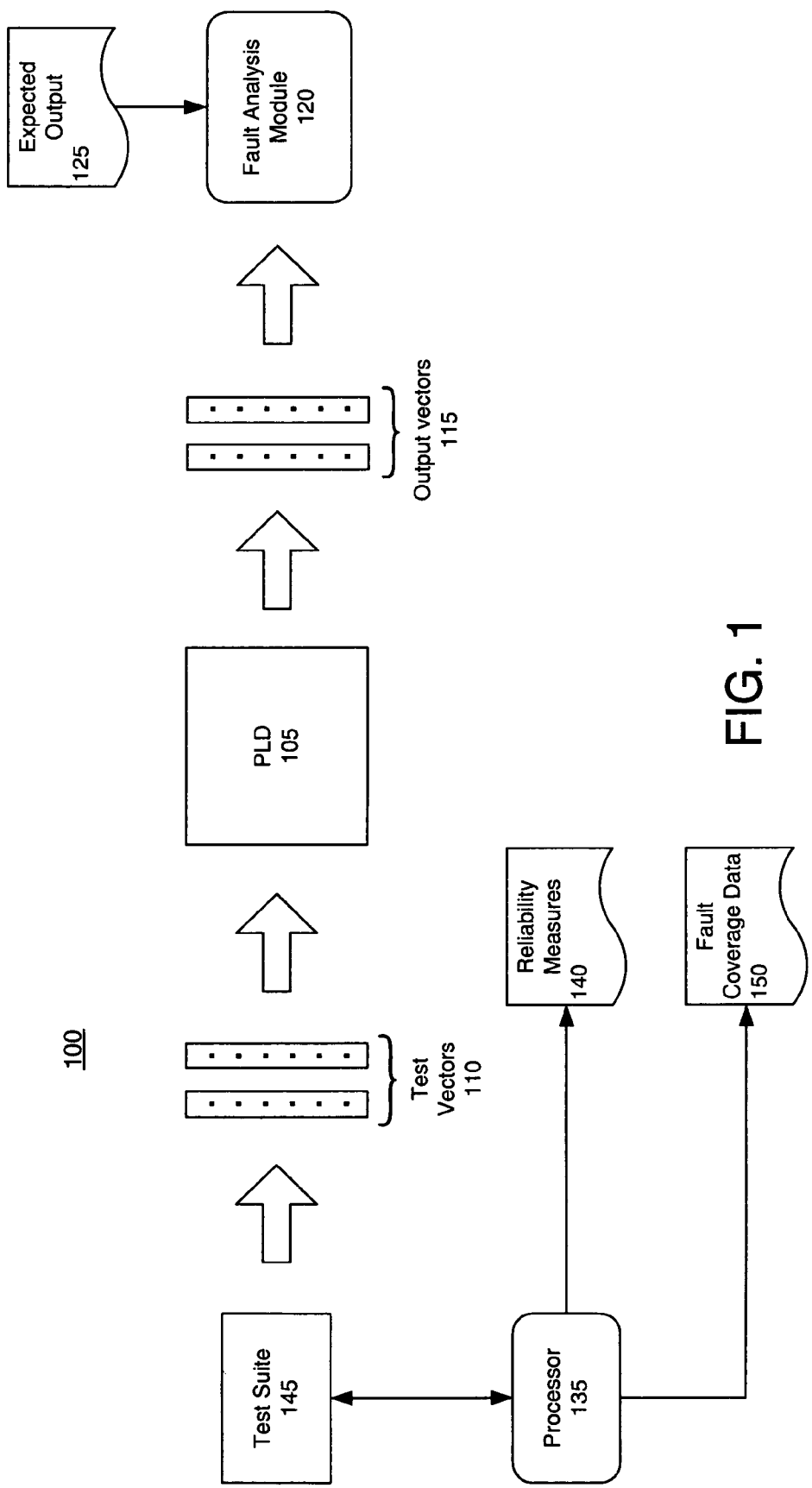
FIG. 1 is a schematic diagram illustrating a system for determining reliability measures and/or fault coverage data for routing resources of a programmable logic device (PLD) in accordance with one embodiment of the present invention.

FIG. 1 is a schematic diagram illustrating a system 100 for determining reliability measures and/or fault coverage data for routing resources of a PLD 105 in accordance with one embodiment of the present invention. In general, the PLD 105 can be subjected to a plurality of different test patterns. A test pattern refers to the configuration data, or bitstream, which programs the device under test to perform one or more functions, as well as the test vectors that are provided to the device under test as input. Each of the test patterns can be targeted to testing, or exercising, particular routing resources such as wires or programmable interconnection points (PIPs) as well as testing for different fault types. In general, a bitstream is loaded into the PLD 105. A series of test vectors 110 can be provided as input. Output vectors 115 can be monitored by a fault analysis module 120. The fault analysis module 120 can compare output vectors 115 with expected output vectors 125 to identify any fault conditions within the PLD 105.

To adequately test PLD 105, a series of test patterns, referred to as a test suite 145, are needed. Each test pattern traditionally is developed by a team of engineers and is targeted to testing particular routing resources of the PLD 105. Thus, the particular routing resources tested by each test pattern of the test suite 145 are known, or can be ascertained. Further, each test pattern can be designed to test or detect particular types of faults such as stuck at 0 (SA0) or stuck at 1 (SA1) faults in reference to a signal being stuck in a low or high state.

In accordance with the inventive arrangements disclosed herein, a processor 135 can process the test suite 145 and generate reliability measures for routing resources of the PLD 105. As the routing resources and particular fault types tested by each test pattern of the test suite 145 are known, or are ascertainable, this information can be used by the processor 135 to generate fault coverage data 150 and/or reliability measures 140. The reliability measures 140 then can be incorporated into a design tool, such as an integrated development environment or an embedded development kit (e.g., the ISE or EDK software tool from Xilinx, Inc. of San Jose, Calif.), for use when routing circuit designs. The reliability measures 140 provide an indication of fault coverage for the routing resources of PLD 105. The reliability measures 140 can be collected and determined for different types, i.e. families or models, of PLDs.

FIG. 2 is a table 200 illustrating fault coverage data and reliability measures in accordance with the inventive arrangements disclosed herein. As shown, table 200 includes columns entitled Routing Resource, SA0 Fault Coverage, SA1 Fault Coverage, and Reliability Measure. The first three columns, particularly Routing Resource, SA0 Fault Coverage, and SA1 Fault Coverage, illustrate the test data that can be collected from the test suite described with reference to FIG. 1. The Reliability Measure column indicates the reliability measures that can be calculated for the listed routing resources based upon the test data.

The Routing Resources column lists various routing resources of the PLD specified as A, B, C, D, E, F, and G. Each letter A-G represents a particular routing resource. As PLDs can include a large number of routing resources, table 200 is shown for purposes of illustration only. As such, it is not intended to limit the scope of the present invention or be suggestive of a PLD having any particular number of routing resources.

The SA0 Fault Coverage and SA1 Fault Coverage columns indicate the number of times each routing resource is tested for a particular type of fault, in this case, for example, stuck at 0 (SA0) and stuck at 1 (SA1) faults, by a test suite. Thus, the fault coverage data specifies that routing resource A is not tested for SA0 or SA1 faults. Routing resource B will be tested 3 times for SA0 faults and 1 time for SA1 faults. It should be appreciated that SA0 and SA1 fault types have been used for purposes of illustration. As such, the present invention is not intended to be limited to the use of any particular fault type or any particular number of different fault types. Rather, any of a variety of different fault types can be detected and used in accordance with the inventive arrangements disclosed herein.

The Reliability Measure column specifies a reliability measure for each of the routing resources A-G. Each reliability measure provides an indication of the extent each routing resource will be tested. In general, routing resources having higher reliability measures are considered to be more reliable than routing resources having lower reliability measures. Thus, routing resource E, having a reliability measure of 14 would be considered to be more reliable than routing resource D, having a reliability measure of 12.

Each reliability measure further provides an indication as to the number of different fault types for which its corresponding routing resource is tested. In general, the more fault types for which a routing resource is tested, the higher the reliability measure will be for that routing resource. As can be seen from FIG. 2, routing resources tested for only one fault type, i.e. either SA0 or SA1, have lower reliability measures than routing resources tested for both SA0 and SA1 fault types. For example, compare routing resources B and C. Correspondingly, routing resources that have been tested for no fault types, i.e. routing resource A, has a 0 reliability measure.

Available circuit test literature suggests that detecting a fault N unique ways results in a more meaningful test for a particular fault type. However, when testing, the particular details of each fault coverage instance may be unknown. It can be assumed, however, that some fault coverage instances, or fault occurrences, are unique, while others are not, i.e. are redundant. For purposes of illustration, N can be assigned a value of 7. That is, if more than 7 fault coverage instances are recorded for a given routing resource, 7 instances can be considered unique, while instances in excess of 7 can be considered redundant. It should be appreciated that the value of 7 chosen for N is by no means the correct value for every design and/or testing situation. Rather, the value of N should be determined by the number of designs in the test suite, the types of tests in the test suite, the types of faults for which the test suite is evaluated, or any combination of these factors.

In one embodiment of the present invention, the reliability measure (RM) can be calculated as follows: RM=(SA0 Fault Coverage+SA1 Fault Coverage)/2+X, where X represents a bonus that can be added to the reliability measure in cases where a routing resource has been tested for all of the fault types represented in the formula, i.e. SA0 and SA1. The value of X can be determined as follows: X=N if SA0 Fault Coverage>0 and SA1 Fault Coverage>0, else X=0. The fault coverage values for fault types SA0 and SA1 both can be limited to N. It should be appreciated that the formula disclosed herein can be scaled for cases where more than 2 fault types are used. In such cases, the fault coverage still can be averaged and the bonus can depend upon whether a particular routing resource has been tested for all fault types concerned.

The following are illustrations of how reliability measures for various routing resources can be calculated in accordance with this embodiment of the present invention. Regarding routing resource B, the test suite tests for the SA0 fault 3 times and the SA1 fault 1 time. Since both fault coverage values are less than N, there is no need to limit either value. Each instance of detecting a particular type of fault is considered unique. Accordingly, both fault coverage values are used within the formula as is. Further, since both are greater than 0, X is set to N, in this case 7. Thus the formula for determining the reliability measure of routing resource B is RM=(3+1)/2+7=9.

Regarding routing resource E, the test suite tests for the SA0 fault 29 times and the SA1 fault 42 times. Since both values are greater than N, which is 7 in this case, both are limited to 7. It is assumed that of all the times each routing resource is tested for a particular fault type, only 7 of the such tests uniquely test for the fault. The fault occurrences above 7, when viewed against the 7 accepted unique instances, are considered redundant instances or cases. Accordingly, the formula can be calculated as RM=(7+7)/2+7=14.

In accordance with this embodiment, N is set to a constant value, 7 in this case, for limiting the fault coverage values and the bonus (X) that is applied. This ensures that the maximum reliability measure for a routing resource that has only a subset of the fault models covered, but not all, is N/FM, where FM is the number of fault models represented. With respect to the illustration provided, the maximum reliability measure for a routing resource that has only SA0 fault coverage or only SA1 fault coverage, but not both, is N/2. This also ensures that the minimum coverage for a routing resource having coverage for all fault models is N+1. The maximum reliability measure for any routing resource is limited to (FM*N) or 2N in the SA0/SA1 fault model illustration provided.

The reliability measures generally function as weights which can be taken into consideration by the router when a PLD design is routed. Routing resources that are assigned higher reliability measures can be favored or given priority over those with lower reliability measures. Thus, if two or more routing resources are being considered by the router (design tool) for routing a given signal path in a PLD, the routing resources having higher, or highest, reliability measures can be selected over those routing resources having lower reliability measures. It should be appreciated that the reliability measures can be used independently of, or in combination with, other metrics such as timing constraints when routing a circuit design.

Figure 3:
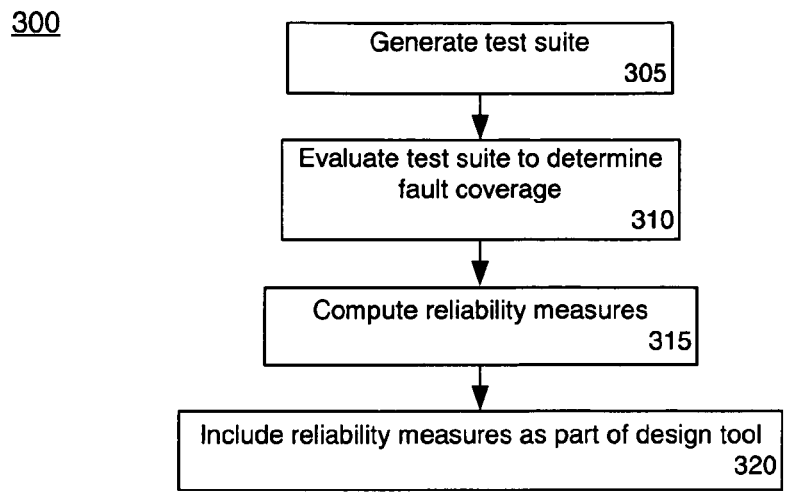
FIG. 3 is a flow chart illustrating a method of determining reliability measures for routing resources in accordance with the inventive arrangements disclosed herein.

FIG. 3 is a flow chart illustrating a method 300 of determining reliability measures for routing resources in accordance with the inventive arrangements disclosed herein. The method 300 can be implemented in a test environment, where test suite(s) are used to test PLDs. Accordingly, embodiments of the present invention can be implemented for any PLD, or type of PLD, for which a test suite has been developed.

The method 300 can begin in step 305 where a test suite having a plurality of test patterns is developed. As noted, a test suite can be developed by one or more test engineers and can be directed or tailored to testing a particular type or model of PLD. Each test pattern of the test suite can test the PLD for particular fault types and exercises, or tests, particular routing resources. This information can be specified by, or ascertainable from, the test suite.

In step 310, the test suite can be evaluated to determine the fault coverage of the test suite. The test suite can be processed to determine the fault coverage information for each routing resource of the PLD, or for selected routing resources. Generally, the fault coverage data can indicate the number of times each routing resource is tested and the number, and type, of faults for which each routing resource is tested. The fault coverage data for each such routing resource can be organized on a per fault basis, for example as illustrated with reference to FIG. 2.

In step 315, reliability measures can be computed for routing resources of the PLD that is tested by the test suite. A reliability measure can be calculated for each routing resource of the PLD for which fault coverage data has been collected. If no fault coverage data is collected for a particular routing resource, a default value can be assigned as a reliability measure. In step 320, the reliability measures can be programmed, or stored, as part of a design tool that is capable of routing functions. As noted, such a design tool then can be made available to circuit designers. Notwithstanding, as noted, the computation of reliability measures also can be performed within the design tool. In that case, fault coverage data for the routing resources can be stored within the design tool such that the reliability measures can be calculated as needed.

Figure 4:
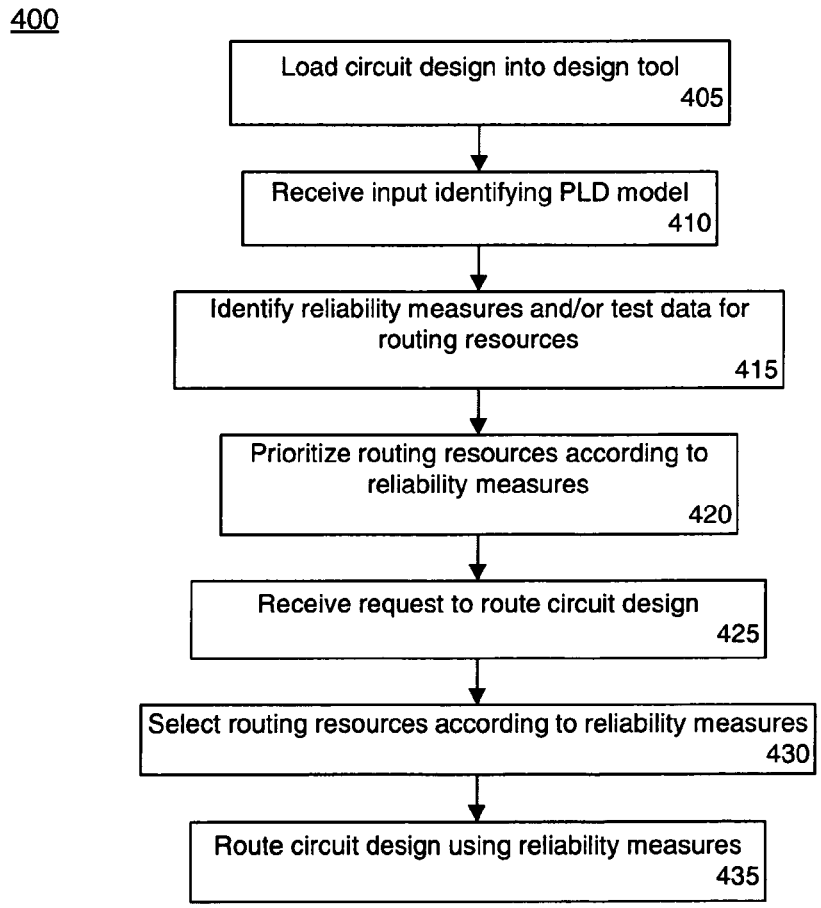
FIG. 4 is a flow chart illustrating a method of routing a design for a PLD in accordance with the inventive arrangements disclosed herein.

FIG. 4 is a flow chart illustrating a method 400 of routing a design for a PLD in accordance with the inventive arrangements disclosed herein. The method 400 can begin in a state where a designer is attempting to route a circuit design for a PLD using a design tool configured as described herein. In step 405, a circuit design can be loaded into the design tool. In step 410, the design tool can receive an input specifying the model of the PLD that is to be used to implement the circuit design. Accordingly, in step 415, any stored parameters, i.e. timing constraints, power consumption constraints, and reliability data, whether test data or reliability measures, for routing resources of the selected PLD model can be recalled or identified.

In step 420, the routing resources optionally can be prioritized according to the reliability measures. The routing resources can be sorted such that routing resources are ordered from the lowest reliability measure to the highest, or vice versa. It should be appreciated, however, that the routing resources can be prioritized at a later time or can be left in an unordered state such that routing resources having desired a reliability measure are selected from an unordered listing of such routing resources. In any case, in step 425 a request to route the circuit design can be received.

In step 430, routing resources can be selected for routing the circuit design according to the reliability measures. Still, it should be appreciated that the selection of routing resources can be based upon design constraints other than reliability measures, such as timing, power consumption, and the like. Selection of routing resources based upon reliability measures can include selecting the most reliable routing resources and/or selecting routing resources having at least a minimum reliability measure. In step 435, the design tool can perform a routing of the circuit design using the reliability measures of the routing resources, i.e. any selected routing resources. More particularly, when routing a circuit design, the design tool can be programmed to favor those routing resources having a higher reliability measure over those having a lower reliability measure.

The tool can be configured to provide the designer with one or more options for routing the circuit design. In one embodiment, an option can be provided which favors route reliability more than any other design constraint. In that case, routing resources having the highest reliability measures can be selected without regard to other design constraints such as power consumption or timing. Such an option would produce a high quality route which may not meet other design constraints.

In another embodiment, design constraints such as timing or power consumption can be applied or favored over reliability measures. Using timing constraints as an example, when routing a particular signal path, the routing resources available for routing that signal path can be identified. Of the available routing resources, those which conform to timing constraints established for the signal path can be identified. That is, the available routing resources can be limited only to those which, if used, will result in a signal propagation delay for the signal path that is less than the timing constraint for the signal path. Of the routing resources that have been determined to meet timing constraints for the signal path, i.e. those that if used produce routes having a signal propagation delay less than a predetermined threshold, the routing resources having the highest reliability measure can be selected to route the signal path. This ensures that any routes will meet established timing constraints and also provide a quality routing, i.e. one having a high reliability measure among the routing resources used.

In another embodiment, where more than one routing resource can be used for routing a signal path and still meet an established timing constraint, and each has a same reliability measure, the routing resource, or set of routing resources, resulting in the fastest, or faster, route with respect to signal propagation delay can be selected. Alternatively, if more than one routing resource would produce a reliable route, i.e. each routing resource has an equivalent reliability measure or has a reliability measure above a particular threshold, and each routing resource, if used, produces a route which conforms with an established timing constraint, the routing resource(s) which produce the smallest, or a smaller, signal propagation delay for the signal path can be selected.

Similar techniques can be used with other varieties of design constraints such as power consumption constraints. Power consumption constraints can be favored over reliability, or reliability over power consumption depending upon designer preference. In illustration, power consumption can be evaluated for a given signal path and be favored or disfavored with respect to reliability. In any case, it should be appreciated that the reliability measures can be used independently of, or in combination with, design constraints when routing a circuit design. When used in combination, however, the particular manner in which design constraints and reliability measures are balanced against one another when selecting a particular routing resource is not intended to limit the scope of the present invention.

The present invention provides a solution for increasing the quality of a circuit design for a PLD. In accordance with the inventive arrangements, fault coverage data for a plurality of routing resources of a PLD can be collected and stored. A reliability measure can be determined for, and assigned to, each of the plurality of routing resources. Subsequently, the reliability measures can be used to constrain a router to use, or favor, those routing resources having higher reliability measures over those with lower reliability measures. The quality of the resulting design can be increased in that routing resources that have been thoroughly tested can be used in lieu of routing resources that have not been tested, or have been tested to a lesser degree.

The present invention can be realized in hardware, software, or a combination of hardware and software. The present invention can be realized in a centralized fashion in one computer system, or in a distributed fashion where different elements are spread across several interconnected computer systems. Any kind of computer system or other apparatus adapted for carrying out the methods described herein is suited. A typical combination of hardware and software can be a general purpose computer system with a computer program that, when being loaded and executed, controls the computer system such that it carries out the methods described herein.

The present invention also can be embedded in a computer program product, which comprises all the features enabling the implementation of the methods described herein, and which when loaded in a computer system is able to carry out these methods. Computer program, software, application, or any variant thereof, in the present context, means any expression, in any language, code or notation, of a set of instructions intended to cause a system having an information processing capability to perform a particular function either directly or after either or both of the following: a) conversion to another language, code, or notation; b) reproduction in a different material form.

This invention can be embodied in other forms without departing from the spirit or essential attributes thereof. Accordingly, reference should be made to the following claims, rather than to the foregoing specification, as indicating the scope of the invention.

What is claimed is:

1. A method of circuit design for a programmable logic device (PLD) comprising:

identifying a plurality of routing resources, wherein each of the plurality of routing resources is associated with a reliability measure;

selecting routing resources for use in routing a circuit design for the PLD according to, at least in part, the reliability measures; and routing the circuit design for the PLD using the selected routing resources, wherein at least two of the plurality of routing resources have an equivalent reliability measure and, if selected, result in a plurality of alternate routes for a signal path, with each alternate route conforming to a design constraint for the signal path, said selecting step further comprising choosing a routing resource from the at least two of the plurality of routing resources that produces the alternate route which conforms to the design constraint to a greater degree.

2. The method of claim 1, said selecting step further comprising, for a signal path, limiting the plurality of routing resources from which routing resources are selected to those that result in a route for the signal path which conforms to a design constraint for the signal path.

3. The method of claim 1, wherein at least one design constraint is specified for the circuit design, said selecting step comprising choosing routing resources for use in said routing step according to the reliability measures and the at least one design constraint, wherein the reliability measures are given a higher priority weight than the at least one design constraint.

4. The method of claim 1, wherein at least two of the plurality of routing resources have a reliability measure that exceeds a threshold and, if selected, result in a plurality of alternate routes for a signal path, with each alternate route conforming to a design constraint for the signal path, said selecting step further comprising choosing a routing resource from the at least two of the plurality of routing resources that produces the alternate route which conforms to the design constraint to a greater degree.

5. The method of claim 1, said selecting step further comprising choosing a routing resource having a higher reliability measure for use during said routing step in lieu of a routing resource having a lower reliability measure.

6. The method of claim 1, wherein the design constraint is at least one of a timing constraint or a power consumption constraint.

7. A method of circuit design for a programmable logic device (PLD) comprising:
   identifying a plurality of routing resources available for routing a signal path of a circuit design for the PLD;
   from the plurality of routing resources, limiting the available routing resources for routing the signal path to those routing resources which meet a design constraint for the signal path; and
   routing the signal path using selected ones of the available routing resources based, at least in part, upon a reliability measure associated with each of the available routing resources,
   wherein at least two of the plurality of routing resources have equivalent reliability measures and, if used to route the signal path, form alternate routes that conform to the design constraint for the signal path, said routing step further comprising selecting a routing resource from the at least two of the plurality of routing resources that produces the alternate route which conforms to the design constraint to a greater degree.

8. The method of claim 7, said routing step further comprising selecting a routing resource having a higher reliability measure in lieu of a routing resource having a lower reliability measure from the available routing resources.

9. The method of claim 7, wherein at least two of the plurality of routing resources have reliability measures that exceed a threshold and, if used to route the signal path, form alternate routes that conform to the design constraint for the signal path, said routing step further comprising selecting a routing resource from the at least two of the plurality of routing resources that produces the alternate route which conforms to the design constraint to a greater degree.

10. The method of claim 7, wherein a routing resource that has been tested for N different fault types has a lower reliability measure than a routing resource that has been tested for N+1 different fault types.

11. The method of claim 7, wherein the design constraint is at least one of a timing constraint or a power consumption constraint.

* * * * *